United States Patent [19]

Okinaga et al.

[11] Patent Number: 5,107,329
[45] Date of Patent: Apr. 21, 1992

[54] PIN-GRID ARRAY SEMICONDUCTOR DEVICE

[75] Inventors: Takayuki Okinaga, Akishima; Kanji Otsuka, Higashiyamato; Hiroshi Akasaki, Ohme, all of Japan

[73] Assignees: Hitachi, Ltd.; Hitachi VLSI Engineering Corp., both of Tokyo, Japan

[21] Appl. No.: 315,608

[22] Filed: Feb. 27, 1989

[30] Foreign Application Priority Data

Feb. 26, 1988 [JP] Japan .................................. 63-42058

[51] Int. Cl.⁵ .................................. H01L 23/12
[52] U.S. Cl. .................................. 357/74; 357/80
[58] Field of Search .................. 357/70, 68, 74, 80; 361/406, 407, 408, 409; 439/68, 69, 70, 72, 73, 74, 75

[56]  References Cited

U.S. PATENT DOCUMENTS 4,724,472  2/1988  Sugimoto et al. .................. 357/80

FOREIGN PATENT DOCUMENTS

| 0019360 | 2/1979 | Japan | 357/74 |
| 59-117139 | 7/1984 | Japan | 357/80 |
| 60-34047 | 2/1985 | Japan | 357/74 |
| 62-24652 | 2/1987 | Japan | 357/72 |
| 0243347 | 10/1987 | Japan | 357/74 |
| 0047961 | 2/1988 | Japan | 357/74 |
| 0166545 | 6/1989 | Japan | 357/74 |

Primary Examiner—Rolf Hille
Assistant Examiner—S. V. Clark
Attorney, Agent, or Firm—Antonelli, Terry, Stout & Kraus

[57]  ABSTRACT

A semiconductor device of pin-grid array (PGA) type, which is adapted for surface-mounting on a printed circuit board, has lead pins arranged in a grid and standing perpendicularly on a base of the semiconductor device. In addition, a few pins are provided which are longer than said lead pins in said grid. When the device is placed on the printed circuit board for mounting, the longer pins are inserted into through-holes which are respectively formed in the printed circuit board to correspond to the position of the longer pins of the device. Thus, the tip of the lead pins are accurately positioned on the top of lands on the printed circuit board, respectively, and the lead pins do not get out of position during the mounting operation.

20 Claims, 4 Drawing Sheets

PIN-GRID ARRAY SEMICONDUCTOR DEVICE

BACKGROUND OF THE INVENTION

1. Field of the Invention

The present invention relates to a semiconductor device of a pin-grid array type. More particularly, it is concerned with a semiconductor of pin-grid array type for surface mounting, and also to a method for mounting the same to a printed circuit board.

2. Description of the Prior Art

A description is given of a pin-grid array (PGA for short hereinafter) which is made up of a semiconductor pellet (pellet for short hereinafter), a substrate on which the pellet is mounted, and a large number of lead pins, in "VLSI Technology" (p. 581) published in 1983 by McGraw-Hill Co., Ltd.

The PGA is conventionally mounted on the printed circuit board by inserting the lead pins of the PGA into through-holes in the printed circuit board. As the number of lead pins of the typical PGA has increased recently, this conventional mounting method has been switched to surface mounting which involves the soldering of the lead pins to the surface of the printed circuit board. The surface mounting of the PGA is typically accomplished by the steps of applying solder cream to the surface of lands (e.g., electrodes) formed on the printed circuit board, placing the package on the printed circuit board, with the tips of the lead pins aligned with the lands, and melting the solder in a reflow furnace, thereby joining the lead pins to the respective lands. A disadvantage of this mounting method is that the lead pins easily get out of position relative to the lands during soldering.

This disadvantage is not so serious in the case of a comparatively light PGA having a relatively small number of pins, because it is positioned correctly on account of the self-aligning effect when the solder reflows. This is not the case with a heavy PGA having a large number of pins which does not permit self-aligning. As a result, the tips of the lead pins get out of the lands during the temporary fitting operation. This causes incomplete connection or continuity between the lead pins and the lands.

The mounting of the PGA to a printed circuit board poses another problem which arises from the fact that the lead pins of the PGA are made slightly soft so that they can absorb strain resulting from an external force applied to the printed circuit board and package or a difference in their coefficient of thermal expansion. Such lead pins are subject to deformation when the PGA is pressed against the printed circuit board for mounting. The deformed lead pins lead to incomplete connection and continuity.

SUMMARY OF THE INVENTION

The present invention was completed to solve the above-mentioned problems. Accordingly, it is an object of the present invention to provide a method for surface-mounting PGAs on the printed circuit board in accurate position. According to the method it is possible to easily and certainly prevent the PGA from getting out of correct position.

The object of the present invention is achieved by providing the PGA with a few alignment lead pins which are longer than the remaining lead pins and also by providing the printed circuit board for surface mounting with holes to receive said longer lead pins.

The object of the invention can also be achieved by providing the printed circuit board for surface mounting with guides to receive some of the lead pins of the PGA.

These and other objects, features and advantages of the invention will become more apparent upon a reading of the following detailed description and appended drawings.

DETAILED DESCRIPTION OF THE INVENTION

Figure 1:
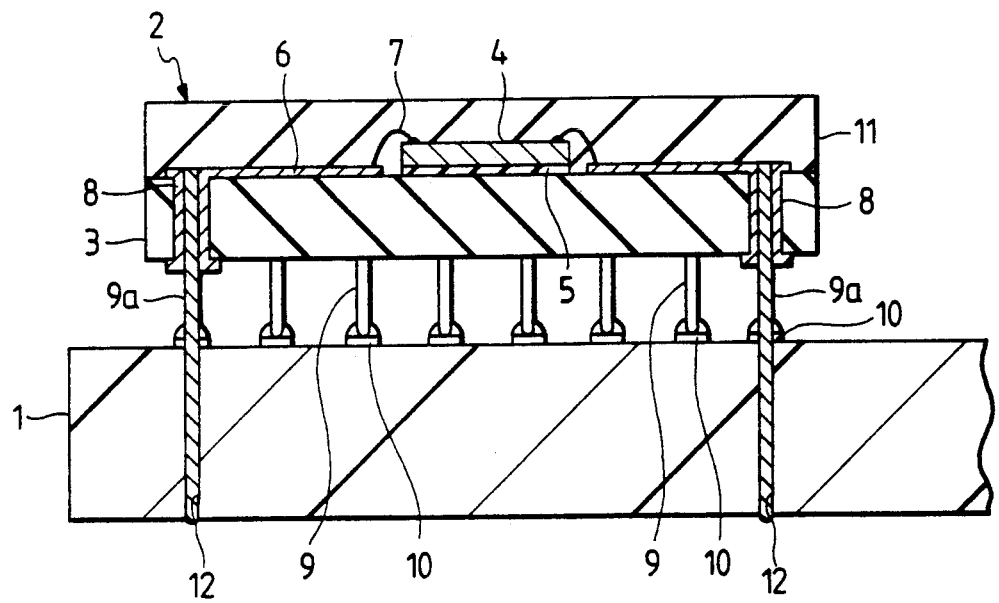
FIG. 1 is a sectional view showing the important parts of the semiconductor device in the first embodiment of the present invention.

The semiconductor device pertaining to the first embodiment of the present invention is shown in section in FIG. 1. It is made up of a printed circuit board 1 and a PGA 2 surface-mounted thereon. The printed circuit board 1 can be made of ceramic material such as alumina, and the PGA 2 is formed on a substrate 3 which can be made of a heat-resistant plastic such as polyimide resin. In the center of the substrate 3 a pellet 4 is mounted in which desired integrated circuits are formed. The pellet is bonded to the substrate 3 with an adhesive 5 which can be of silver paste type, although the invention is not limited to this. For example, synthetic resin type adhesive, or other appropriate adhesives, could be used.

The pellet 4 is surrounded by pattern-formed wirings 6 of copper foil, and each electrode pad (not shown) of pellet 4 is connected to one end of each copper foil wiring 6 through a bonded aluminum or gold wire 7.

In the periphery of the substrate 3 are formed a large number of through-holes 8 electrically connected to the copper foil wirings 6. Into each through-hole is inserted and fixed the upper part of a lead pin 9 made of 42-alloy or the like.

The lower tip of each lead pin 9 is soldered to the top of land 10 formed from aluminum on the top of the board 1, so that electrical connection is established between the PGA 2 and the internal wiring layer (not shown) of the board 1. Although it is not shown in FIG. 1, it is to be understood that each lead pin 9 passes through a through-hole 8 in the substrate 3 to be electrically connected to the copper foil wirings 6. In this way, an electrical connection is established between the internal wiring layer (not shown) on the board 1 and the electrode pads (not shown) on the pellet 4 via the wires 7, the wirings 6, the lead pins 9 and the lands 10. This also holds true for the other embodiments discussed hereinafter.

The upper surface of the substrate 3 is entirely sealed with a potting resin 11 such as epoxy resin, so that the pellet 4 and the copper foil wiring 6 are isolated from the external environment.

The PGA 2 pertaining to this embodiment is characterized by the fact that the four lead pins 9a (two of which are shown in FIG. 1) inserted into the through-holes 8 at the four corners of the substrate 3 are longer than the remaining lead pins 9 (which each have their tip in contact with the top of a land 10). In other words, unlike the leads 9, the four lead pins 9a are inserted into the four holes 12 (two of which are shown in FIG. 1), respectively, formed in the board 1, and the ends of the four lead pins 9a slightly project from the back of the board 1.

The hole 12 is a via hole which passes through from the bottom of the land 10 opposite to the long lead pin 9a to the back of the board 1. It has an inside diameter which is approximately equal to or slightly larger than the outside diameter of the lead pin 9a.

The surface mounting of the PGA 2 to the board 1 is accomplished in the following manner. At first, solder paste is applied to the top of the lands 10 formed on the top of the board 1. Then, the PGA 2 is placed on the top of the board and the longer lead pins 9a at the four corners of the substrate 3 are inserted into the holes 12 in the board 1. Thus, the PGA 2 is temporarily fixed, with each of the lead pins 9 accurately positioned on the top of each land 10. Finally, the board 1 on which the PGA 2 is temporarily fixed is heated in a reflow furnace so that the solder is melted. Thus, each lead pin 9 is securely joined to each land 10 without getting out of position.

This embodiment is constructed such that the four lead pins 9a inserted into the through-holes 12 at the four corners of the board are longer than the remaining lead pins. The scope of the present invention is not limited to the particular details of this embodiment. An alternative embodiment may be constructed such that two lead pins on a diagonal line are longer than the remaining lead pins. And, of course, the number of longer lead pins 9a can be set at a different number than two or four.

According to this embodiment, the longer lead pins 9a completely pass through the board 1. However, this is not essential. The desired effect is produced so long as the holes 12 are deep enough to receive the longer pins 9a when the PGA is placed in position, with the lead pins 9 aligned with the respective lands 10 on the board 1.

The effects of the first embodiment are as follows:

(1) At the time of surface-mounting of the PGA 2 to the board 1, the PGA 2 is temporarily fixed on the board, with the tips of the lead pins 9 in accurate position on the top of the respective lands 10, because the long lead pins 9a extending from the substrate 3 of the PGA 2 are inserted into the hole 12 formed in the board 1. The thus temporarily fixed lead pins 9 do not get out of position after the reflowing of solder.

(2) Since the lead pins 9 do not get out of position as mentioned in (1) above, secure continuity is established, and this leads to the improved reliability of the semiconductor device.

(3) The secure positioning mentioned in (1) makes it possible to increase the number of pins on the PGA 2 and also to increase the mounting density on the board 1.

(4) It is possible to prevent the lead pins 9 from getting out of position simply by inserting the long lead pins 9a into the holes 12 in the board 1. This contributes to the improved mounting efficiency.

Figure 2:
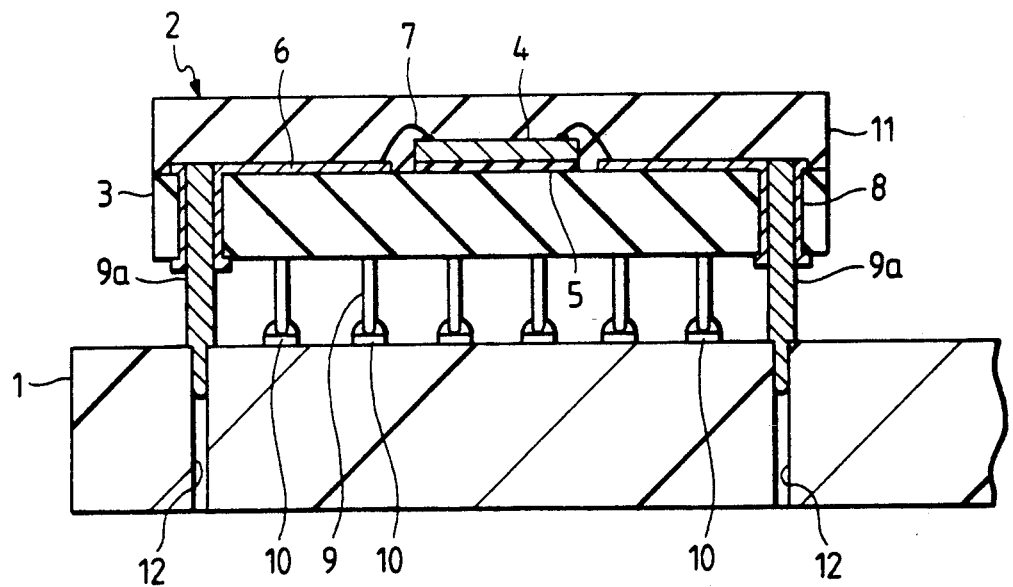
FIG. 2 is a sectional view showing the important parts of the semiconductor device in the second embodiment of the present invention.

The second embodiment of the present invention is shown in section in FIG. 2. According to this embodiment, the four lead pins 9a at the corners of the PGA 2 are constructed with a thick and a thin diameter portion such that the part inserted and fixed into the substrate 3 has a larger diameter than the part at the other end which will be inserted into the hole 12. Also, the thicker part of the lead pins 9a has a larger diameter than the remaining lead pins 9. The board 1 has the holes 12 at the corresponding positions of the lead pins 9a. The hole 12 has an inside diameter equal to or slightly larger than the outside diameter of the thin part of the lead pin 9a.

According to this embodiment, the mounting of the PGA 2 on the board 1 is accomplished by inserting the thin part of the lead pin 9a into the hole 12 in the board 1. When the stepped part of the lead pin 9a comes into contact with the board 1, the tips of the remaining lead pins 9 are accurately positioned on the top of the lands 10 on the board 1.

The effects of the second embodiment are as follows:

(1) At the time of surface-mounting of the PGA 2 to the board 1, the tips of the lead pins 9 are accurately positioned on the top of the respective lands 10 as the thin part of the long lead pin 9a is inserted into the hole 12 formed in the board 1. At the time of insertion, the stepped part of the long pin 9a functions as a stopper in the vertical direction, thereby preventing the tips of the lead pins 9 from being excessively pressed against the lands 10 and hence preventing the lead pins 9 and substrate 3 from deformation. This contributes to the secured continuity and the improved reliability of the semiconductor device.

(2) Since the thicker part (close to the substrate 3) of the lead pin 9a has a larger diameter than the remaining lead pins 9, the lead pins 9a are stronger than the remaining lead pins 9. Thus, the lead pins 9a protect the remaining pins 9 from deformation so long as they stay intact. In other words, the PGA in this embodiment resists deformation better than the structure with the longer lead pins having the same diameter as the regular lead pins.

In this embodiment, the lead pins 9a are made thicker than the remaining lead pins 9 to impart strength. However, in an alternative embodiment, the lead pins 9a may be made of a different material from that for the remaining pins 9 to achieve the same object.

Figure 3:
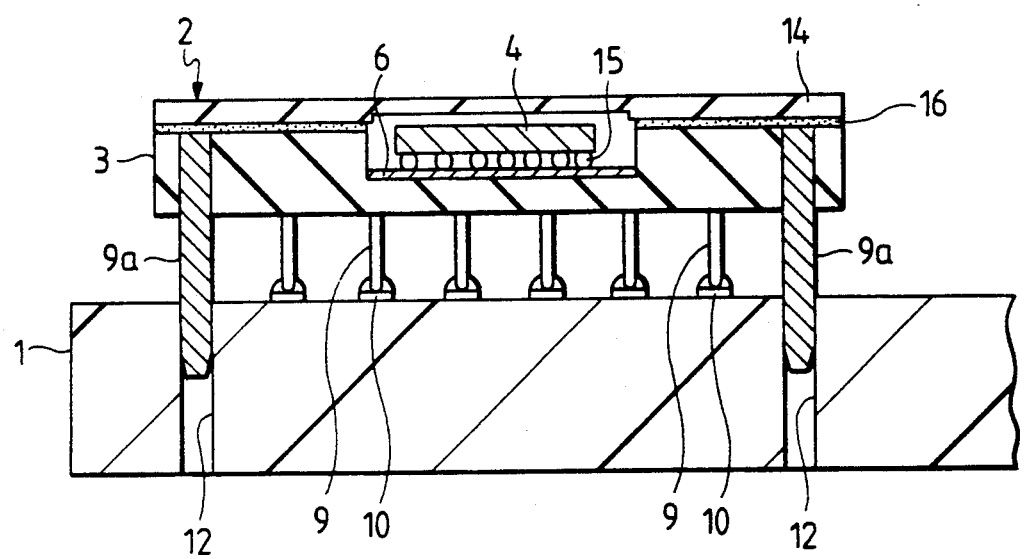
FIG. 3 is a sectional view showing the important parts of the semiconductor device in the third embodiment of the present invention.

The third embodiment of the present invention is shown in section in FIG. 3. According to this embodiment, the PGA 2 is based on the ceramics substrate 3 having good heat dissipation properties. At the center of the substrate 3 is formed a recessed part in which is mounted the pellet 4. On the lower surface of the pellet 4 is formed integrated circuits, and on the pads (terminals to be connected to the external terminals) are formed solder balls 15.

The pellet 4 is bonded to the substrate 3 through the solder balls 15 which melt when the pellet 4 is heated in a furnace after it has been placed on the copper foil pattern 6 formed in the recessed part in the substrate 3.

The pellet 4 in the recessed part is hermetically sealed by a cap 14 made of ceramics or metal, which is bonded to the substrate 3 with a low-melting glass or the like.

According to this embodiment, the four lead pins 9a at the corners of the PGA 2 are thicker and longer than the remaining lead pins 9. At the time of surface-mounting of the PGA 2 to the board 1, the lead pins 9a are inserted into the holes 12 having an inside diameter slightly larger than the outside diameter of the lead pins 9a, so that the remaining lead pins 9 are accurately positioned on the corresponding lands 10 on the board 1.

The lead pins 9a which are thicker than the remaining lead pins 9 prevent the lead pins 9 from getting out of the lands 10 when the PGA 2 receives an external force in the lateral direction at the time of mounting and after mounting.

The thicker lead pins 9a also serve as a heat sink which transmits heat from the pellet 4 to the board 1. This function is effectively achieved when the lead pins 9a are made of Kovar, tungsten, molybdenum, aluminum, copper, or the like.

Figure 4:
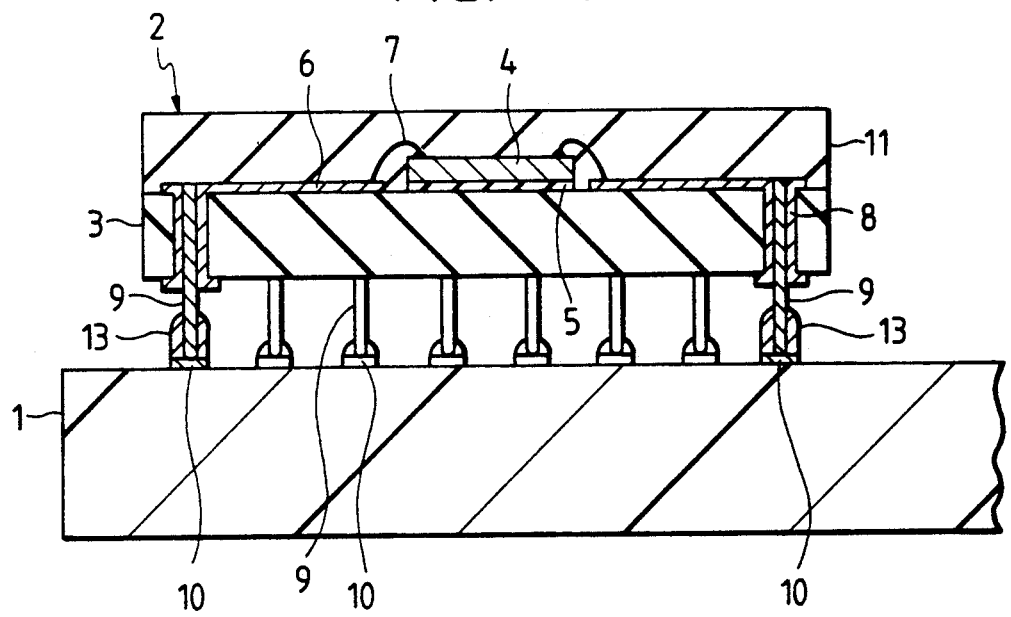
FIG. 4 is a sectional view showing the important parts of the semiconductor device in the fourth embodiment of the present invention.

The fourth embodiment of the present invention is shown in section in FIG. 4. According to this embodiment, the PGA 2 is surface-mounted on the board 1 with solder, with the lead pin 9 inserted in the corresponding guide 13 bonded to the land 10 formed on the top of the board 1. The guide 13 is a cylindrical object made of aluminum or the like. It has an inside diameter approximately equal to or slightly greater than the outside diameter of the lead pin 9, and it is bonded to the top of the land 10 with a brazing filler metal. It is not always necessary to bond the guides 13 to all of the lands 10. Usually, four guides for four lead pins 9 at the four corners of the substrate will suffice.

According to this embodiment the surface-mounting of the PGA 2 to the board 1 is accomplished in the following manner. At first, solder paste is applied to the top of the guide 13 and the surface of the lands 10 (excluding those to which the guides 13 are bonded). Then, the PGA 2 is placed on the board 1 so that the lead pins 9 are inserted into the corresponding guides 13. Thus, the PGA 2 is temporarily fixed with the tips of the lead pins 9 accurately positioned on the corresponding land 10. Finally, the assembly of the board 1 and the PGA 2 is heated in a reflow furnace to melt the solder. Thus, the lead pins 9 are bonded to the corresponding lands 10 without misalignment.

This indicates that the fourth embodiment also produces substantially the same effect as that of the above-mentioned three embodiments.

Although the invention has been described in it preferred form, it is to be understood that the invention is not limited to them but widely different embodiments thereof may be made without departing from the spirit and scope thereof. For example, the long lead pins and/or the guides may be changed in number and position as desired. Also, although a particular cross-sectional shape has been shown for the lands 10, the invention is not limited to any particular shape or size for these lands.

Figure 5:
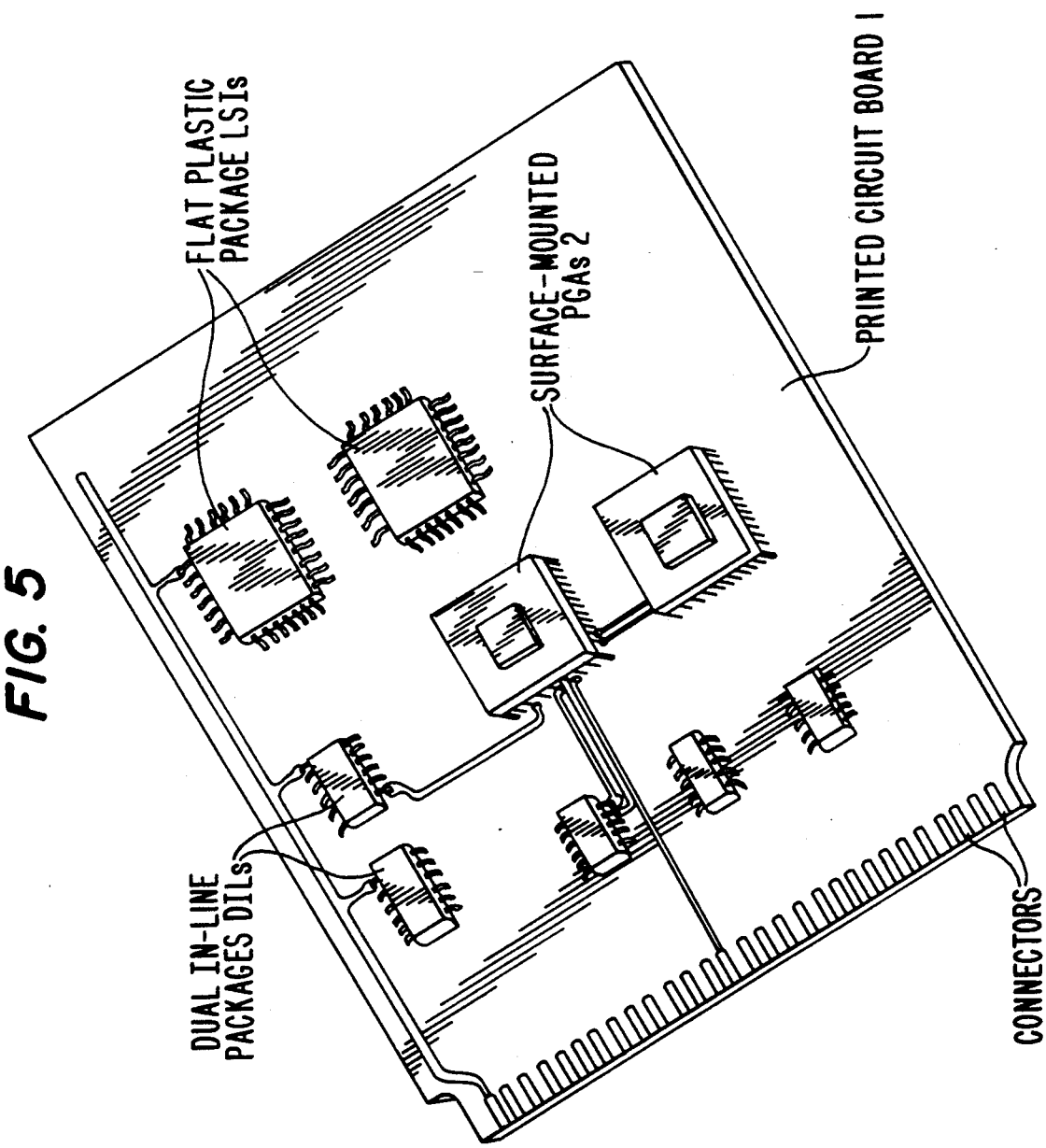
FIG. 5 is a perspective view showing a printed circuit board arrangement which can be used in conjunction with the PGA embodiments of the present invention.

In the foregoing, mention is made of the case in which one PGA is mounted on the board. Needless to say, the present invention may be applied to the case where a plurality of PGAs are mounted on a single board. FIG. 5 provides an illustration of such an arrangement wherein a pair of surface-mounted PGAs 2 are mounted on a printed circuit board 1 along with other types of semiconductor devices.

Figure 6:
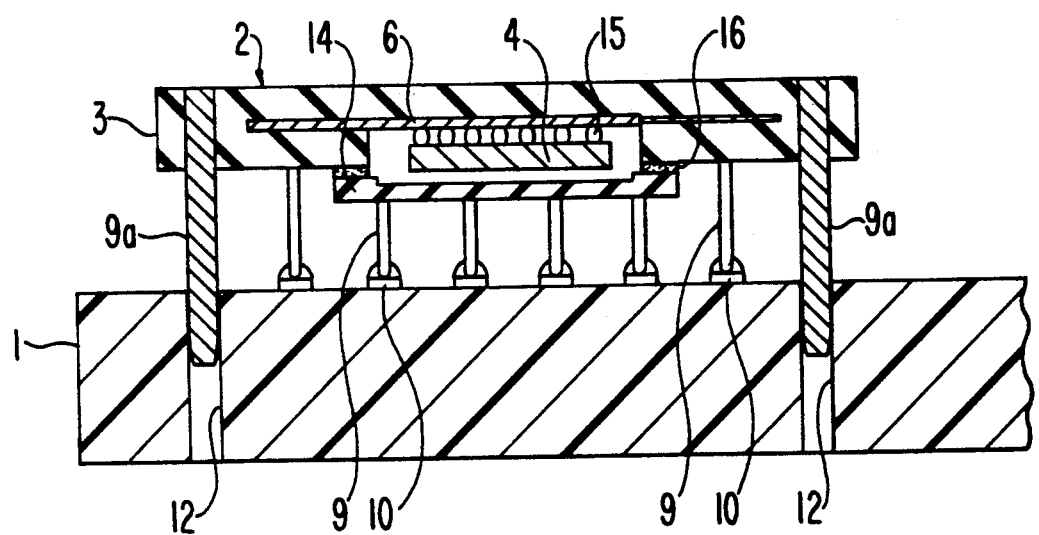
FIG. 6 shows a modification of the invention.

FIG. 6 shows a modification which also falls within the scope of the present invention. Specifically, in FIG. 6, the base is inverted so that the pellet is mounted face down. Such a mounting arrangement can be used together with any of the alignment arrangements discussed for the foregoing embodiments.

The typical effects of the invention disclosed herein are summarized below.

To begin with, a very important advantage is that it is possible to easily and certainly prevent the PGA from getting out of position when it is surface-mounted on the board with solder, because some of the lead pins of the PGA are longer than the remaining ones and the holes to receive these longer lead pins are formed in the printed circuit board.

Using the present invention, it is also possible to position the PGA accurately in the vertical direction relative to the board, because some of the lead pins of the PGA can be provided with a stepped part which comes into contact with the board.

It is also possible to prevent the lead pins from being deformed by an external force applied to the PGA and to ensure continuity between the lead pin and the land, because some of the lead pins of the PGA can be made thicker than the remaining lead pins. It is also possible to increase the heat dissipation efficiency because the lead pins transmit heat from the semiconductor device to the board.

In addition to the above features, it is possible to easily and certainly prevent the PGA from getting out of position at the time of surface-mounting of the PGA to the board with solder using the fourth embodiment, because the lead pins of the PGA are inserted into the guides formed on the board.

It is to be understood that the above-described arrangement are simply illustrative of the application of the principles of this invention. Numerous other arrangements may be readily devised by those skilled in the art which embody the principles of the invention and fall within its spirit and scope.

We claim:

1. A semiconductor device adapted for surface mounting on a printed circuit board, comprising:
   a base, which comprises a main surface, a rear surface and a side surface, having a plurality of electrically conductive patterns on a main surface thereof;
   a semiconductor pellet mounted on said main surface of said base, having an integrated circuit which includes a plurality of external terminals;
   a plurality of conducting means for electrically connecting said external terminals and first ends of said electrically conductive patterns, respectively;
   a plurality of lead pins mounted perpendicularly on said rear surface of said base and being arranged in a gird, wherein said lead pins are coupled to second ends of said patterns for transferring electric signals from the second ends of the patterns to the outside of the base and;
   at least one alignment pin, which is longer than said lead pins, said alignment pin being arranged at a periphery of said base, wherein said alignment pin is adapted to be inserted into a predetermined hole in said printed circuit board in order to establish and maintain a predetermined position of the lead pins relative to the printed circuit board, and wherein said alignment pin is thicker along its entire length than said lead pins and has a greater strength than said lead pins.

2. A semiconductor device according to claim 1, wherein said at least one of said alignment pin is also a lead pin for transferring an electric signal from the second end of one of said electrically conductive patterns to the outside of the base.

3. A semiconductor device according to claim 1, wherein a plurality of said alignment pins are located at each corner of the grid.

4. A semiconductor device according to claim 1, wherein said semiconductor pellet includes an integrated circuit formed on one surface of the pellet which is opposite to a surface of the pellet which is bonded to said main surface of said base with an adhesive.

5. A semiconductor device according to claim 4, wherein said adhesive is a silver-paste-type adhesive.

6. A semiconductor device according to claim 4, wherein said adhesive is synthetic resin.

7. A semiconductor device according to claim 6, further including cover means for covering said semiconductor pellet to isolate the integrated circuit formed on the semiconductor pellet from the external environment.

8. A semiconductor device according to claim 7, wherein said cover means is made of an epoxy resin and wherein said base is made of a plastic polyimide resin.

9. A semiconductor device according to claim 7, wherein said cover means is made of a metal and said base is made of a ceramic.

10. A semiconductor device according to claim 7, wherein said cover means and said base are made of ceramic material.

11. A semiconductor device according to claim 1, wherein said pellet includes a first surface facing toward said rear surface of said base and a second surface facing away from said rear surface of said base, wherein an integrated circuit is formed on said first surface.

12. A semiconductor device according to claim 11, wherein said first surface of said pellet is bonded to said base with solder balls.

13. A semiconductor device according to claim 12, further including cover means for covering said semiconductor pellet to isolate the integrated circuit formed on the semiconductor pellet from the external environment.

14. A semiconductor device according to claim 13, wherein said cover means is made of an epoxy resin and wherein said base is made of a plastic polyimide resin.

15. A semiconductor device according to claim 13, wherein said cover means is made of a metal and said base is made of a ceramic.

16. A semiconductor device according to claim 13, wherein said cover means and said base are made of ceramic material.

17. A printed circuit board structure having a plurality of semiconductor devices thereon, comprising:
at least one of said semiconductor devices including:
a base having a plurality of electrically conductive patterns on a first surface thereof;
a semiconductor pellet mounted on the first surface of said base, and having an integrated circuit which includes a plurality of external terminals;
a plurality of conducting means for electrically connecting said external terminals and first ends of said electrically conductive patterns, respectively;
a plurality of lead pins mounted perpendicularly on a surface of said base opposite to said first surface and being arranged in a grid, wherein said lead pins are coupled to second ends of said patterns for transferring electric signals from the second ends of the patterns to the outside of the base; and
a plurality of alignment pins, which are longer than said lead pins, and which are arranged at a periphery of said base; and
a printed circuit board having a plurality of lands arranged in a grid for receiving and transferring electric signals to another semiconductor device or to an external terminal of the printed circuit board, said printed circuit board further including holes formed to have a slightly larger diameter than a diameter or said alignment pins of said semiconductor device,
wherein said at least one of said semiconductor devices is mounted on said printed circuit board so that tips of the lead pins are contacted to the top of the lands and said alignment pins are inserted into the holes in said printed circuit board, respectively, and wherein each of said alignment pins is thicker along its entire length than said lead pins.

18. A semiconductor device according to claim 1, wherein said alignment pins ar arranged at four corners of said base.

19. A printed circuit board structure according to claim 17, wherein a plurality of said alignment pins are located at each corner of the grid.

20. A printed circuit board structure according to claim 17, wherein said alignment pins are arranged at four corners of said base.

* * * * *